(12) United States Patent
Terashima et al.

(10) Patent No.: US 11,940,391 B2
(45) Date of Patent: Mar. 26, 2024

(54) DEFECT INSPECTION APPARATUS, METHOD FOR INSPECTING DEFECT, AND METHOD FOR MANUFACTURING PHOTOMASK BLANK

(71) Applicant: Shin-Etsu Chemical Co., Ltd., Tokyo (JP)

(72) Inventors: Ryusei Terashima, Niigata (JP); Takumi Yoshino, Niigata (JP); Tsuneo Terasawa, Niigata (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 17/712,031

(22) Filed: Apr. 1, 2022

(65) Prior Publication Data

US 2022/0317061 A1    Oct. 6, 2022

(30) Foreign Application Priority Data

Apr. 5, 2021    (JP) .................... 2021-063981

(51) Int. Cl.
| | | |
|---|---|---|
| *G01N 21/95* | (2006.01) | |
| *G01N 21/88* | (2006.01) | |
| *G01N 21/956* | (2006.01) | |
| *H01L 21/66* | (2006.01) | |

(52) U.S. Cl.
CPC ..... *G01N 21/9501* (2013.01); *G01N 21/8806* (2013.01); *G01N 21/95607* (2013.01); *H01L 22/12* (2013.01); *G01N 2021/95615* (2013.01); *G01N 2021/95676* (2013.01)

(58) Field of Classification Search
CPC .......... G01N 21/9501; G01N 21/8806; G01N 21/95607; G01N 2021/95615; G01N 2021/95676; H01L 22/12; G03F 1/84
See application file for complete search history.

(56) References Cited

U.S. PATENT DOCUMENTS

| | | | | |
|---|---|---|---|---|
| 6,635,872 | B2 * | 10/2003 | Davidson ............. | G01N 23/225 250/306 |
| 7,804,591 | B2 * | 9/2010 | Kim ................. | G01N 21/95607 356/237.4 |
| 8,639,019 | B2 * | 1/2014 | Sakai ............... | G01N 21/95607 356/625 |
| 2005/0147287 | A1 | 7/2005 | Sakai et al. | |

(Continued)

FOREIGN PATENT DOCUMENTS

| | | |
|---|---|---|
| JP | H06-129992 A1 | 5/1994 |
| JP | 2001027611 A | 1/2001 |

(Continued)

OTHER PUBLICATIONS

Office action from corresponding Japanese Patent Applicaton No. 2021-063981 dated Jan. 30, 2024, and its English translation from Global Dossier.

*Primary Examiner* — Hung V Nguyen
(74) *Attorney, Agent, or Firm* — Ladas & Parry, LLP

(57) ABSTRACT

A defect inspection apparatus has a defect detection unit 152 that acquires first defect information on a defect of a photomask blank MB as a substrate; and a comparative information acquisition unit 150 that acquires a result of comparison between predetermined defect information stored in a storage unit 155 and the first defect information.

9 Claims, 7 Drawing Sheets

(56) References Cited

U.S. PATENT DOCUMENTS

| | | | |
|---|---|---|---|
| 2006/0133660 A1* | 6/2006 | Ogi | G06T 7/001 |
| | | | 382/149 |
| 2006/0280358 A1* | 12/2006 | Ishikawa | G01N 21/95607 |
| | | | 382/149 |
| 2016/0231234 A1* | 8/2016 | Hensley | G01N 21/94 |
| 2018/0209916 A1 | 7/2018 | Terasawa et al. | |

FOREIGN PATENT DOCUMENTS

| | | |
|---|---|---|
| JP | 2001-050907 A1 | 2/2001 |
| JP | 2002-296197 A1 | 10/2002 |
| JP | 2003004654 A | 1/2003 |
| JP | 2005-158780 A1 | 6/2005 |
| JP | 2018-120211 A1 | 8/2018 |

* cited by examiner

DEFECT INSPECTION APPARATUS, METHOD FOR INSPECTING DEFECT, AND METHOD FOR MANUFACTURING PHOTOMASK BLANK

BACKGROUND

Technical Field

The present invention relates to a defect inspection apparatus for a defect of a substrate, a method for inspecting a defect, and a method for manufacturing a photomask blank.

The present application claims the priority of Japanese Patent Application No. 2021-063981 filed on Apr. 5, 2021, the contents of which are entirely incorporated by reference.

Background Art

In a process of manufacturing a semiconductor device, a photolithography technique is used in which a pattern transfer mask is irradiated with exposure light, and a circuit pattern formed on the mask is transferred onto a semiconductor substrate (semiconductor wafer) using a reduction optical system.

The pattern transfer mask is manufactured by forming a circuit pattern on a substrate (mask blank) on which a thin optical film is formed. Such an optical film is generally a film containing a transition metal compound as a main component or a film containing a silicon compound containing a transition metal as a main component, and a film functioning as a light shielding film, a film functioning as a phase shift film, or the like is selected according to a purpose. Examples of the optical film may include a hard mask film that is a processing assist film intended for high-precision processing of the optical film.

This pattern transfer mask is used as an original view for manufacturing a semiconductor element having a circuit pattern. Thus, when the pattern transfer mask has a defect, the defect is transferred to the circuit pattern. For this reason, the pattern transfer mask is required to be defect-free. This naturally requires also a photomask blank to be defect-free. Under such circumstances, many studies have been made on a technique for detecting a defect of a photomask or a photomask blank.

Examples of an apparatus for detecting a defect of a photomask blank, a glass substrate, or the like include a known inspection apparatus configured such that a substrate is irradiated with laser light, scattered light due to a defect on a surface of the substrate is received by a photodetector, and presence of the defect is detected based on an output signal from the photodetector. For example, JP 2001-27611 A discloses a defect inspection apparatus that scans a surface of a sample using a plurality of light beams and detects reflected light from the sample with a photodetector. JP 2003-4654 A discloses a detection optical system that scans a surface of a sample with an optical spot and detects information on a surface region of the sample with reflected light from the surface of the sample, and that includes a light shielding plate disposed in an optical path to shields one-half of the optical path in a direction corresponding to a scanning direction of the optical spot, and a photodetector that outputs a signal indicating a shape so that a protruding defect and a depressed defect are determined based on the shape.

SUMMARY OF INVENTION

Problem to be Solved by Invention

The pattern transfer mask is used as an original plate of a fine pattern, so that all defects on the pattern transfer mask that hinder fidelity of pattern transfer must be eliminated. Thus, even in a manufacturing stage of a mask blank, all defects that hinder mask pattern formation need to be detected.

Each of the inspection apparatuses described in JP 2001-27611 A and JP 2003-4654 A uses an optical method for detecting a defect. The optical method for detecting a defect has an advantage in that a wide area can be inspected for a defect in a relatively short time, and a fine defect of about several 10 nm can be precisely detected by shortening a wavelength of a light source.

However, the study of the inventors of the present application reveals that the inspection apparatuses disclosed in JP 2001-27611 A and JP 2003-4654 A have low capability of detecting a depressed defect present in a thin film that is relatively transparent to inspection light and has a thickness of 10 nm or less, and cannot detect a relatively large defect of about several 10 µm depending on a shape of the defect.

Examples of a mechanism causing the depressed defect include a cleaning step of a substrate performed after the optical film is formed. That is, when a thin optical film is formed on a substrate to which particles or the like adhere before the thin optical film is formed, a protruding defect derived from the particles is detected in an inspection of the thin optical film. After through the subsequent cleaning step, a large particle may be removed together with the optical film thereon to cause a depressed defect in the optical film. Although such a depressed defect has a relatively large size, the optical film made of a material relatively transparent to the inspection light causes the defect inspection apparatus to be less likely to detect the depressed defect.

A depressed defect of several 10 µm in mask blanks fatally influences subsequent circuit pattern formation. Thus, it is desired to establish a method capable of increasing a detection rate of a fatal defect that can be overlooked and eliminating a substrate having the fatal defect.

The present invention is made to solve the above problems, and an object of the present invention is to provide a defect inspection apparatus and a method for inspecting a defect, being configured to detect and analyze a defect that can be overlooked and improve reliability of inspection, and a method for manufacturing photomask blanks, using the method for inspecting a defect.

Means for Solving Problem

[Concept 1]
A defect inspection apparatus may comprise:
a defect detection unit that acquires first defect information on a defect of a substrate; and
a comparative information acquisition unit that acquires a result of comparison between predetermined defect information stored in a storage unit and the first defect information.

[Concept 2]
In the defect inspection apparatus according to concept 1,
the defect detection unit may acquire second defect information on a defect before a predetermined processing for the substrate by a substrate processing unit,
the second defect information may be used as the predetermined defect information, and
the comparative information acquisition unit may acquire the result of comparison between the second defect information and the first defect information.

[Concept 3]

In the defect inspection apparatus according to concept 2, the predetermined processing may be cleaning processing of the substrate

[Concept 4]

In the defect inspection apparatus according to any one of concepts 1 to 3, the comparative information acquisition unit may acquire a place where change has occurred as positional information based on change information obtained as the result of comparison between the predetermined defect information and the first defect information.

[Concept 5]

The defect inspection apparatus, according to concept 4, may further comprise a display unit that displays an enlarged image according to the positional information.

[Concept 6]

In the defect inspection apparatus according to any one of concepts 1 to 5, the substrate may have multiple layers, The substrate may have an optical thin film having a thickness of 10 nm or less as an outermost surface layer, and the comparative information acquisition unit may acquire positional information on a defect where a part of the optical thin film is removed.

[Concept 7]

In the defect inspection apparatus according to any one of concepts 1 to 6, each of the first defect information and the predetermined defect information may include positional information and a size of the defect.

[Concept 8]

In the defect inspection apparatus according to any one of concepts 1 to 7, the first defect information may be acquired by irradiating inspection light, and the inspection light for the substrate may be moved by scanning the inspection light or moving the substrate.

[Concept 9]

A method for inspecting defect may comprise:

acquiring first defect information on a defect of a substrate; and acquiring a result of comparison between predetermined defect information stored in a storage unit and the first defect information.

[Concept 10]

A method for manufacturing photomask blank may comprise:

selecting a photomask blank by using the method for inspecting defect according to concept 9.

The present invention enables detecting and analyzing defects of photomask blanks that can be overlooked by a conventional optical method for inspecting a defect. Applying the method for inspecting a defect of the present invention enables eliminating a photomask blank having a huge depressed defect that is a fatal defect.

DETAILED DESCRIPTION

Hereinafter, embodiments of the present invention will be described.

A process of manufacturing a photomask from a photomask blank will be described.

FIGS. 1A to 1F are explanatory diagrams of an example of a process of manufacturing a photomask from a photomask blank, and are sectional views of the photomask blank, an intermediate, or a photomask in corresponding stages of the process of manufacturing a photomask. The photomask blank includes a transparent substrate provided with a thin film such as at least one optical thin film or processing auxiliary thin film.

Figure 1A:
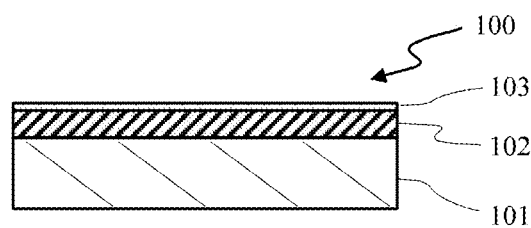
FIG. 1A is a sectional view illustrating an outline of an example of a process of manufacturing a photomask from a photomask blank.
Figure 1B:
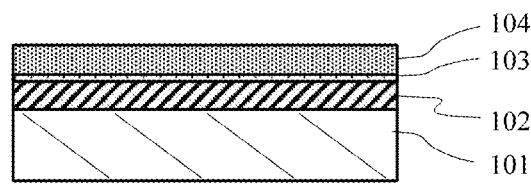
FIG. 1B is a sectional view illustrating an outline of an example of a process of manufacturing a photomask from a photomask blank, following FIG. 1A.
Figure 1C:
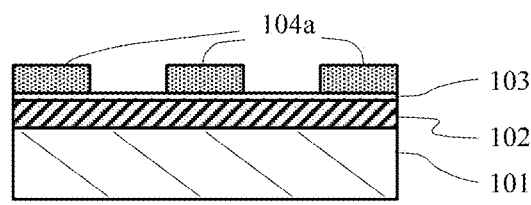
FIG. 1C is a sectional view illustrating an outline of an example of a process of manufacturing a photomask from a photomask blank, following FIG. 1B.
Figure 1D:
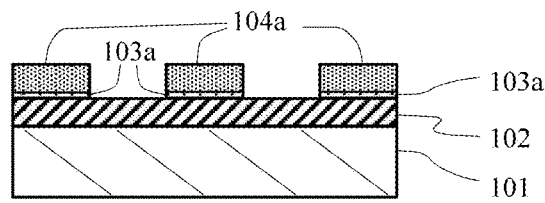
FIG. 1D is a sectional view illustrating an outline of an example of a process of manufacturing a photomask from a photomask blank, following FIG. 1C.
Figure 1E:
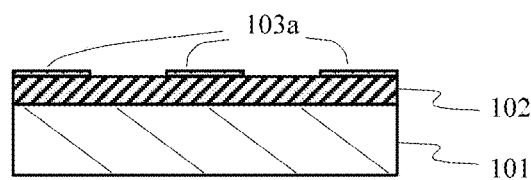
FIG. 1E is a sectional view illustrating an outline of an example of a process of manufacturing a photomask from a photomask blank, following FIG. 1D.
Figure 1F:
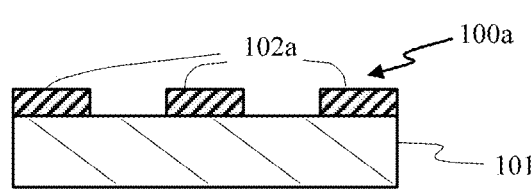
FIG. 1F is a sectional view illustrating an outline of an example of a process of manufacturing a photomask from a photomask blank, following FIG. 1E.

FIG. 1A illustrates a photomask blank 100 that includes a transparent substrate 101 on which an optical thin film 102 functioning as a phase shift film such as a light shielding film or a halftone phase shift film is formed, and a hard mask film (processing auxiliary thin film) 103 that is formed on the optical thin film. When a photomask is manufactured from such a photomask blank, first, a resist film 104 for processing the photomask is formed on the hard mask film 103 (see FIG. 1B). Next, a resist pattern 104a is formed from the resist film through a lithography process by an electron beam lithography method or the like (see FIG. 1C). Subsequently, the hard mask film 103 of a lower layer is processed using the resist pattern 104a as an etching mask to form a hard mask film pattern 103a (see FIG. 1D), and then the resist pattern 104a is removed (see FIG. 1E). Then, when the optical thin film 102 of a lower layer is processed using the hard mask film pattern 103a as an etching mask, an optical thin film pattern 102a is formed. After that, when the hard mask film pattern 103a is removed, a photomask 100a is obtained (see FIG. 1F).

Figure 2A:
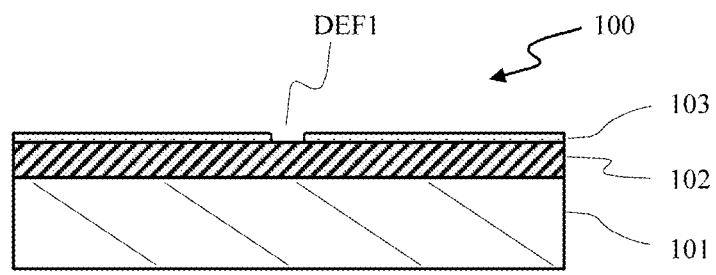
FIG. 2A is a sectional view illustrating an example in which a depressed defect exists in a hard mask film of a photomask blank.
Figure 2B:
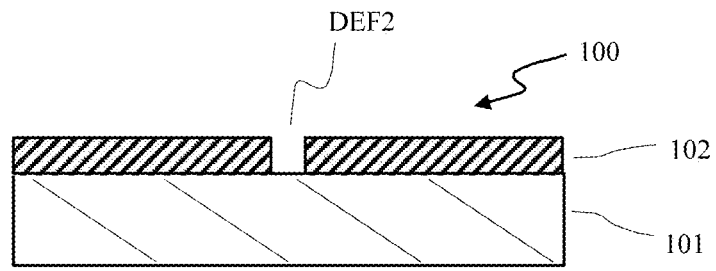
FIG. 2B is a sectional view illustrating an example in which a depressed defect exists in an optical thin film of a photomask blank.

Presence of a depressed defect such as a pinhole defect in a thin film of the photomask blank finally causes a development pattern defect on the photomask. FIGS. 2A and 2B each illustrate an example of a typical depressed defect of the photomask blank. The concept of the "defect" of the present embodiment includes not only a defect formed on a substrate such as a pinhole defect (depressed defect) but also foreign matter such as a particle of dust or the like attached to a substrate.

FIG. 2A illustrates an example of the photomask blank 100 in which a depressed defect DEF1 exists in the hard mask film 103 that is formed on the optical thin film 102 to perform high-precision processing of the optical thin film 102 formed on the transparent substrate 101. FIG. 2B is a sectional view illustrating an example of a photomask blank in which a depressed defect DEF2 exists in the optical thin film 102 itself formed on the transparent substrate 101.

Figure 2C:
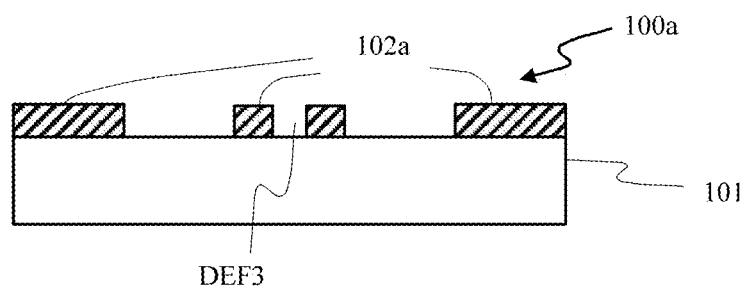
FIG. 2C is a sectional view illustrating a photomask manufactured from a photomask blank in which a defect exists.

When a photomask is manufactured from any one of the photomask blanks illustrated in FIGS. 2A and 2B by the manufacturing process illustrated in FIGS. 1A to 1F, the photomask includes the optical thin film pattern 102a in which a depressed defect DEF3 derived from the photomask blank exists as with the photomask 100a illustrated in FIG. 2C. The depressed defect DEF3 then causes a pattern transfer error in exposure using the photomask.

Figure 3A:
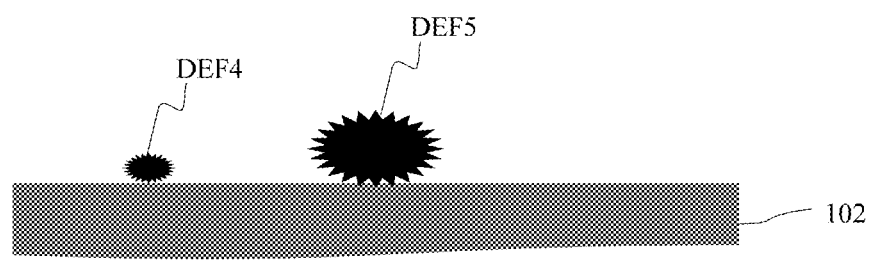
FIG. 3A is a sectional view illustrating a photomask blank that is immediately before a hard mask is formed and in which a defect exists.
Figure 3B:
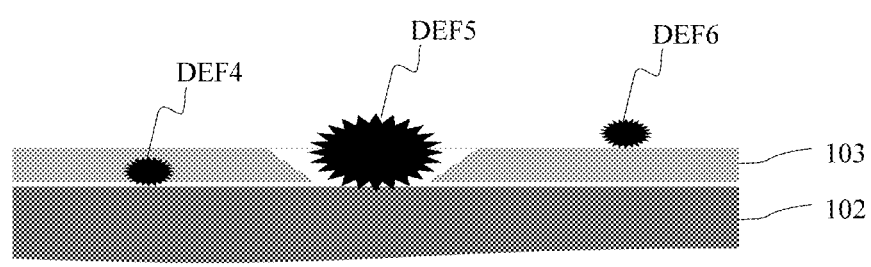
FIG. 3B is a sectional view of the photomask blank after the hard mask is formed, following FIG. 3A.
Figure 3C:
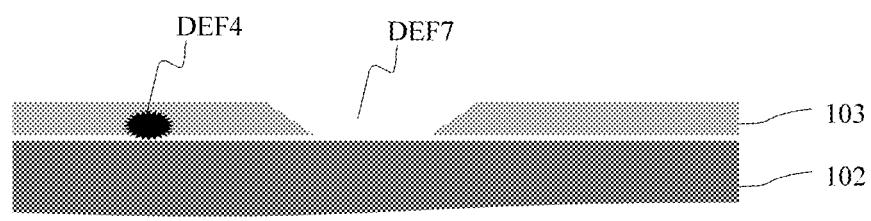
FIG. 3C is a sectional view of the photomask blank after cleaning, following FIG. 3B.

Then, FIGS. 3A to 3C illustrate a mechanism in which an additional depressed defect is generated through the cleaning step of a substrate.

FIG. 3A is a diagram illustrating a surface immediately before a thin hard mask film is formed in manufacture of a photomask blank. On the surface of a substrate, particles DEF4 and DEF5 exist adhering to the surface. When the hard mask film 103 is formed here, an aspect as illustrated in FIG. 3B is obtained. FIG. 3B illustrates the aspect in which besides the defects DEF4 and DEF5 generated before the hard mask film 103 is formed, a particle DEF6 exits adhering to the hard mask film 103 when the hard mask film 103 is formed. Through the cleaning step, the particle DEF6 attached when the hard mask film 103 is formed can be removed, but the particle DEF5 having a large size attached before the hard mask film 103 is formed is also removed to cause a depressed defect DEF7 in the shape of a hole in the hard mask film 103 (see FIG. 3C).

The depressed defect DEF7 also causes a pattern transfer error in exposure using the photomask. Thus, a depressed defect of the photomask blank needs to be detected in a stage before the photomask blank is processed so that the photomask blank having the defect is eliminated or the defect is corrected.

As described above, elimination of the depressed defect that is a fatal defect existing in the photomask blank is a key to quality assurance of photomask blanks. Thus, an inspection method with high reliability for the depressed defect is desired to be provided.

Figure 4:
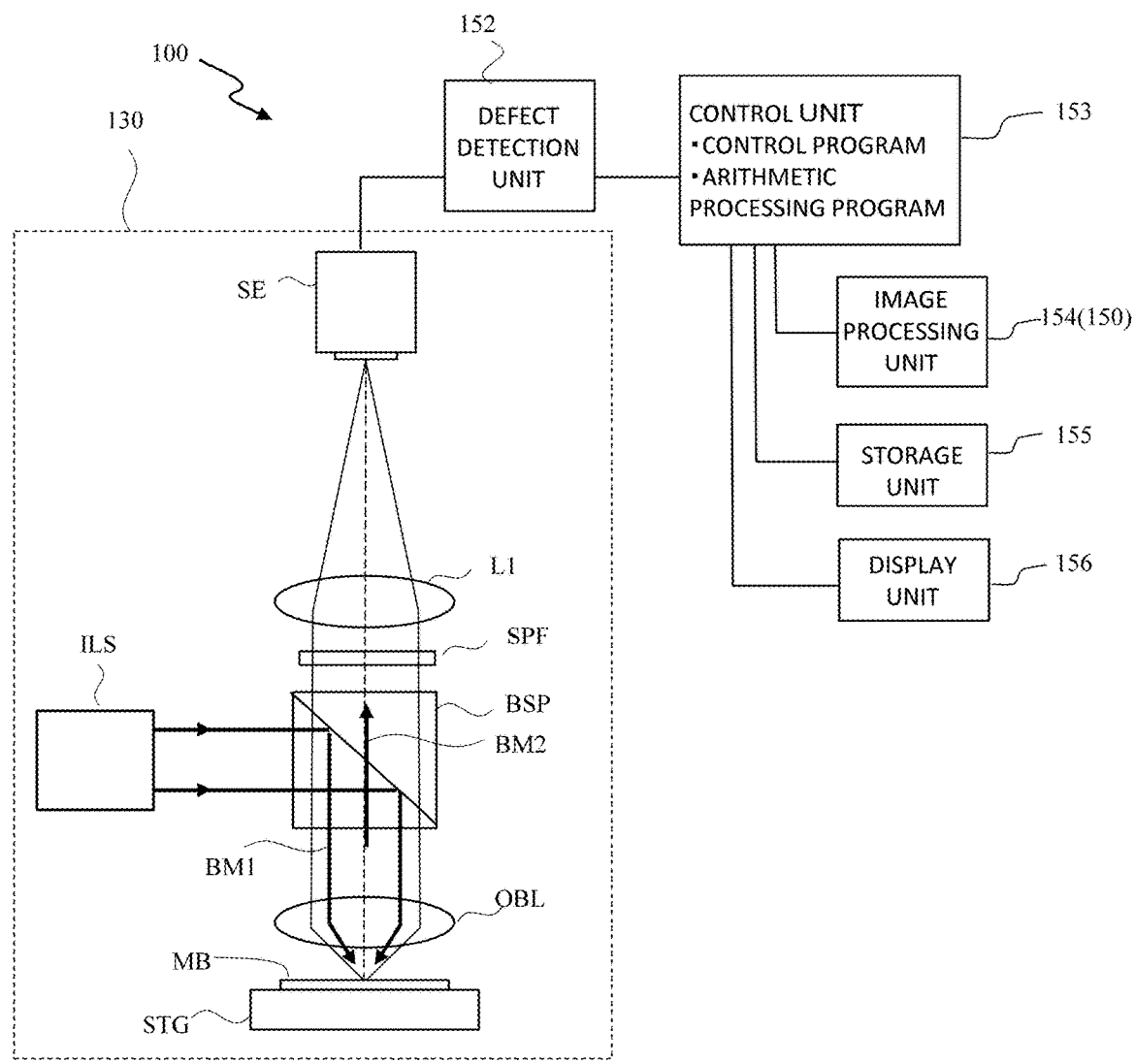
FIG. 4 is a diagram illustrating an example of a configuration of an inspection apparatus used for inspecting defects of photomask blanks.

FIG. 4 is a block diagram conceptually illustrating an example of a configuration of an inspection apparatus suitably used for inspecting a defect in a surface of a photomask blank. Although FIG. 4 illustrates an aspect in which a photomask blank MB is used as a substrate, the present invention is not limited to the aspect. A defect inspection apparatus 110 of the present embodiment includes a defect detection unit 152 that acquires information on a defect of a substrate, a storage unit 155 that stores various kinds of information, and a comparative information acquisition unit 150 that acquires a result of comparison between predetermined defect information stored in the storage unit 155 and first defect information. In the present embodiment, an aspect will be described, for example, in which predetermined defect information and first defect information are each image information. FIG. 4 illustrates the aspect in which an image processing unit 154 that performs image processing functions as the comparative information acquisition unit 150.

A control unit 153 includes a control program for performing various kinds of control and an arithmetic processing program for performing various kinds of arithmetic processing, the programs being installed, and is configured to perform control and arithmetic processing based on the programs. The control unit 153 includes various image calculation programs installed, and thus may perform a part of processing in the image processing unit 154. In this case, both the control unit 153 and the image processing unit 154 function as the comparative information acquisition unit 150 unlike the above-described aspect in which the image processing unit 154 functions as the comparative information acquisition unit 150.

Figure 7:
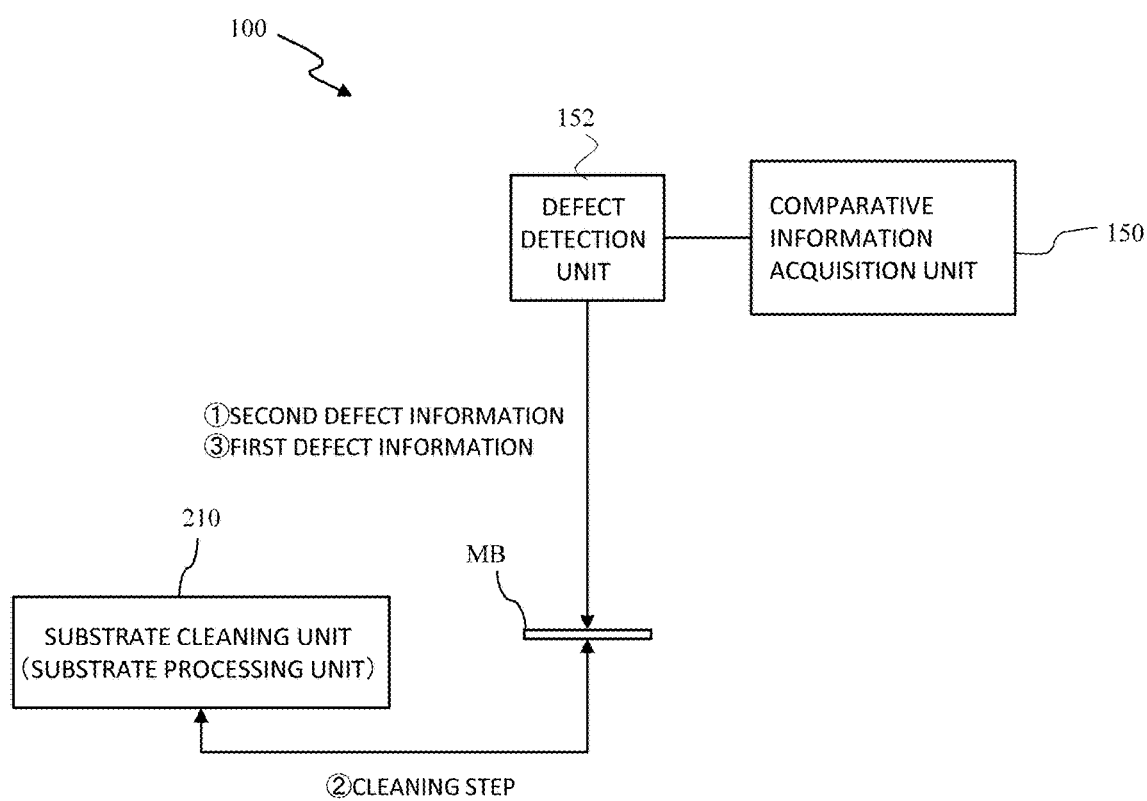
FIG. 7 is a block diagram of a defect inspection apparatus according to the present embodiment.

A substrate processing unit that performs predetermined processing on the photomask blank MB may be provided (see FIG. 7). Before the predetermined processing, the defect detection unit 152 may acquire second defect information on the defect. The second defect information may be the predetermined defect information described above. The predetermined processing may be cleaning processing of a substrate. In this case, the substrate processing unit includes a substrate cleaning unit 210 (see FIG. 7).

The defect detection unit 152 may be configured to generate an enlarged image of the defect based on positional information stored in the storage unit 155 to check and analyze the defect. The image processing unit 154 may generate such an enlarged image. Such an enlarged image may be also displayed on a display unit 156 including a display or the like.

The image processing unit 154 may acquire a place where change has occurred (e.g., a position of a defect removed by the cleaning processing) as the positional information based on change information obtained as a result of comparing the second defect information that is the predetermined defect information and the first defect information.

The display unit 156 may be configured to enable displaying a place, where a defect is considered to be present, in an enlarged manner. The display unit 156 may be also configured to enable displaying a place, where the defect removed by the cleaning processing has existed, obtained as a result of comparing the second defect information with the first defect information, in an enlarged manner. The display unit 156 may be further configured to enable displaying the place, where the defect removed by the cleaning processing has existed, in an enlarged manner, in an image synthesized by adding the positional information on the place, where the defect removed by the cleaning processing has existed, to an image after the cleaning. The defect may be checked or analyzed by using such an enlarged image.

For example, the image processing unit 154 compares the second defect information with the first defect information, and identifies the position of the place where the defect is removed after the cleaning processing among defects existing in the second defect information. The image processing unit 154 performs this identification by comparing and analyzing the image in the second defect information and the image in the first defect information. When the positional information on the defect removed after the cleaning processing is obtained, the positional information may be added to the image in the second defect information to generate a new image. The display unit 156 may display the place identified as described above in an enlarged manner automatically or by being operated by an operator. The display unit 156 displays an image that is processed by the image processing unit 154, and in which the place where the defect is removed may be highlighted (e.g., it may be displayed surrounded by a red frame). When multiple defects are removed, places of the respective removed defects may be sequentially enlarged and automatically displayed in response to a command from the control unit 153. Besides the aspect described above, a list of removed defects may be displayed to individually select a removed defect from the list, and a place where the removed defect has existed may be displayed in an enlarged manner.

The storage unit 155 may store, as a recipe, a series of processing on the substrate (photomask blank MB) in the defect inspection apparatus 110 and the substrate cleaning unit 210 (see FIG. 7) that is an example of the substrate processing unit, according to the present embodiment. Then, the series of processing on the substrate in the defect inspection apparatus 110 and the substrate cleaning unit 210 may be automatically performed by reading out the recipe from the storage unit 155.

For example, the defect inspection apparatus 110 mainly includes an inspection optical system 130, the defect detection unit 152, the control unit 153, the image processing unit 154 that processes an image, the storage unit 155 that stores various kinds of information, and the display unit 156. The control unit 153 may control the entire defect inspection apparatus 110 based on a control program.

The present embodiment provides a program to be installed in the control unit 153 and a storage medium including a USB memory storing the program. The control unit 153 and the image processing unit 154 of the defect inspection apparatus 110 according to the present embodiment may be generated by installing such a program in a computer. The present embodiment also provides a non-transitory tangible media storing such a program.

The defect detection unit 152, the control unit 153, the image processing unit 154, and the like of the present embodiment may be fabricated by one unit (control unit) or may be fabricated by different units. Functions of a plurality of "units" may be integrated and implemented by one unit (control unit). The defect detection unit 152, the control unit 153, the image processing unit 154, and the like may be fabricated by a circuit configuration.

The defect detection unit 152 and/or the comparative information acquisition unit 150 may have an artificial intelligence function to perform machine learning using previous result data and sample data. More specifically, the defect detection unit 152 may generate a defect detection model for detecting a defect using previous result data and sample data (learning data) to detect a defect in a substrate to be subsequently detected using the defect detection model. Additionally, the comparative information acquisition unit 150 may generate a comparison result detection model for detecting a change (e.g., a defect lost after cleaning) using previous result data and sample data (learning data) to detect a change (a defect lost after cleaning) in a substrate to be subsequently detected using the comparison result detection model. The defect detection model and the comparison result detection model may be generated using a plurality of adoption variables and an adoption coefficient that is a weight for each of the adoption variables.

The inspection optical system 130 is basically configured as a confocal optical system, and may have a stage STG that is movable by being equipped with a light source ILS that emits inspection light, a beam splitter BSP, an objective lens OBL, and a photomask blank MB, and an image detector SE.

The inspection light may have a wavelength passing through the optical thin film. The inspection light may have a wavelength of 210 nm to 550 nm. For example, inspection light BM1 emitted from the light source ILS is bent by the beam splitter BSP and passes through the objective lens OBL to illuminate a predetermined region of the photomask blank MB. Light BM2 reflected by a surface of the photomask blank MB is collected by the objective lens OBL, and passes through the beam splitter BSP, a spatial filter SPF that blocks a part of light, and a lens L1 to reach a light receiving surface of the image detector SE. At this time, the image detector SE is adjusted for position such that the light receiving surface of the image detector SE is at a position conjugate with the surface of the photomask blank MB.

The inspection light BM1 is scanned in one direction by a scanner (not illustrated), and the stage STG moves in a direction orthogonal to the scanning direction. The scanning of the inspection light and movement of a circuit board to be inspected are combined to inspect the circuit board to be inspected, within a predetermined region. When a variation larger than a predetermined level is found in intensity of reflected light captured by the image detector SE, it is determined that a defect exists. When the defect is detected, a size of the defect predicted from position information on the defect and intensity distribution of the reflected light is sequentially memorized and stored. Subsequently, a two-dimensional enlarged image of a small region including a defected part is generated again based on the stored positional information to check and analyze the defect.

As described above, the combination of processes of two stages of inspection light scanning in the predetermined region of the substrate and the two-dimensional enlarged image generation only in the region where the defect is detected in the scanning enables achieving both high speed of defect inspection and accuracy of defect analysis.

For example, a configuration as illustrated in FIG. 4 may be adopted to inspect a substrate to be inspected, within a predetermined region, by combining scanning of inspection light and movement of the substrate to be inspected, and when a defect is detected, positional information on the defect and a size of the defect may be sequentially stored in the storage unit 155.

The substrate may have multiple layers. The substrate to be inspected may have an optical thin film having a thickness of 10 nm or less as an outermost surface layer. The optical thin film may be transparent to the inspection light. The defect analyzed as described above may be a depressed defect having a size of several 10 μm (several 10 μm or more) in the optical thin film.

Figure 5:
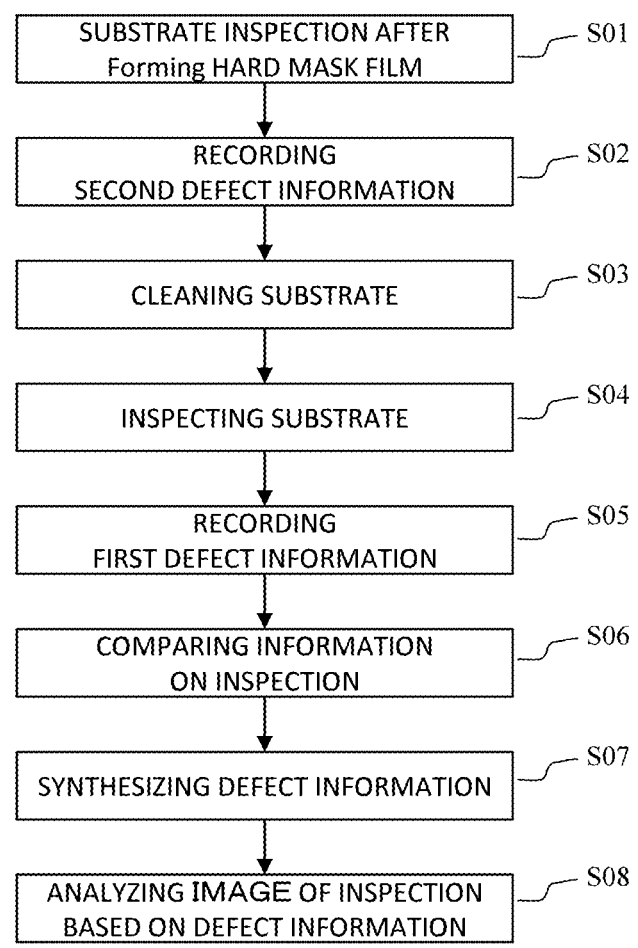
FIG. 5 is a flowchart of a method for inspecting a defect according to an embodiment of the present invention.

Next, an example of a method for inspecting a defect according to the present embodiment will be described with reference to a flowchart of FIG. 5.

First, after a hard mask film is formed, presence or absence of a defect in a blank surface is inspected as an inspection performed before the cleaning step (step S01). A position of the defect detected by the inspection and an image of the defect are acquired to record defect information (step S02). The storage unit 155 performs this storage. Although the storage unit 155 may be incorporated in the optical inspection apparatus, the storage unit 155 may be disposed at a remote location, or may be a server or the like. The defect information may include a size, a position, and/or an unevenness determination result of the defect. At this time, an image (two-dimensional enlarged image) of coordinates based on the defect information may be acquired, and the acquired image may be analyzed in detail to determine presence or absence of a defect.

After the inspection, processing proceeds to the cleaning step (step S03), and dust such as particles adhering to a surface of a film when the film is formed is removed. At this time, when the particles attached before the film is formed each have a height equal to or more than a thickness of the film formed, the particles are probably removed by the cleaning step. Thus, a part of a surface film layered outermost is also removed together with the particles, so that a depressed defect can be formed in the surface film (see FIGS. 3B and 3C).

After the cleaning step, a defect in the surface film is inspected again by the optical inspection apparatus (step S04). From a result obtained by the inspection, a defect image and defect information are recorded (step S05). At this time, a depressed defect generated due to the cleaning step may be overlooked, so that the defect information on the result of the inspection performed after the cleaning step is compared with defect information on the result of the inspection performed before the cleaning step to extract positional information on an undetected defect in the inspection performed after the cleaning step (step S06). That is, the information on the defect in the inspection before cleaning is compared with the information on the defect in the inspection after the cleaning to extract information on a position of each of defects (DEF5 and DEF6) that are not detected after the cleaning. Then, the information on the position (e.g., information based on coordinates) is added to image data captured after the cleaning to display the image data on the display unit 156 (step S07). Subsequently, an image (two-dimensional enlarged image) at the position of each of the defects that are not detected after the cleaning is acquired to determine presence or absence of a defect by analyzing the acquired image in detail (step S08). Analyzing the acquired image in detail as described above enables detecting a depressed defect such as DEFT, which is conventionally less likely to be detected. Additionally, only the position of the defect that is not detected after the cleaning is to be analyzed in detail, so that time required for analysis, and the like can be reduced.

The photomask blank is manufactured through various processes including steps of forming and cleaning optical films of various materials, and a defect is appropriately inspected between the processes. Defect information obtained by the inspection may be recorded in a recording device attached to the defect inspection apparatus 110, or may be recorded in a recording device of a higher-level management system that manages states of a plurality of inspection devices, thereby recording and reading out the defect information as appropriate. These recording devices are included in the concept of the storage unit 155 in the present embodiment.

Acquiring an image at an undetected position by the above method enables detecting a cleaning-derived depressed defect that cannot be detected in the step of inspecting a defect. At this time, a plurality of imaging devices may be used for analysis in a step of acquiring an image at the undetected position and analyzing a defect.

The method described above includes the steps of: inspecting the substrate after the hard mask film is formed; acquiring the second defect information; further acquiring the first defect information after the cleaning; and further comparing the first defect information with the second defect information, and thus is advantageous in that information on a defect that is conventionally easily overlooked can be more reliably acquired.

When the above-described method for checking a defect is used, photomask blanks may be selected in which no depressed defect is included or no large depressed defect of 10 μm or more is included. This case provides, for example, a method for manufacturing photomask blanks, the method including the steps of: forming at least one thin film and a hard mask film, which is a processing auxiliary layer of the thin film, on a substrate; and checking and analyzing a defect present in the thin film or the hard mask film by the method for checking a defect.

Although the present invention will be specifically described below with reference to Examples, the present invention is not limited to the Examples below.

Example

An undetected defect in an inspection after cleaning was detected and analyzed based on an inspection result before the cleaning after a film is formed in a step of forming SiOx of 10 nm on an outermost surface of a photomask blank. After the film is formed, defects on photomask blanks were inspected using the inspection optical system illustrated in FIG. 4 at a numerical aperture NA of 0.95 and an inspection wavelength of 532 nm before passing through the cleaning step. Positional information on the defect obtained by the inspection was recorded, and the cleaning step was conducted.

After the photomask blanks were cleaned, defects on the photomask blanks were inspected using an optical inspection apparatus having a numerical aperture NA of 0.85 and an inspection wavelength of 355 nm. Positional information on the defect obtained by the inspection was recorded, and the defect undetected after passing through the cleaning step was extracted by the inspection of a defect before the cleaning step and after the cleaning step.

Figure 6:
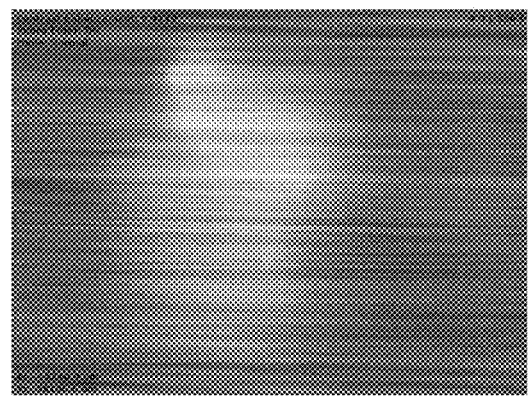
FIG. 6 is an example of a review image of a depressed defect.

A result of the inspection before the cleaning was used to perform imaging of coordinate positions of decreased defects using the defect inspection apparatus 110. FIG. 6 shows an image that was found after presence or absence of a defect and a shape of the defect were analyzed based on the obtained image. From this image, it was considered that this defect was a very huge defect exceeding several 10 μm.

The defect obtained by the above method was analyzed by AFM analysis, and the shape of the defect was measured. As a result, it was found that the defect was a huge defect in a depressed shape. The above method enabled a depressed defect on the hard mask, which is a fatal defect, to be detected. That is, the above method enabled detecting a defect that was not detected in the inspection after the cleaning and that could be overlooked in a conventional manufacturing flow.

Additionally, a substrate including a pinhole defect being a fatal defect was eliminated by applying a method for classifying unevenness of a defective part of the present invention, so that a photomask blank without including a defect was able to be provided.

An aspect of the present invention provides a technique for improving detection performance of a depressed defect. An aspect of the present invention particularly can be suitably used as a technique of inspecting a defect of a photomask blank, the technique being effective in detecting a depressed shape such as a pinhole present in a thin film formed on the photomask blank.

REFERENCE SIGNS LIST 100 photomask blank
101 transparent substrate
102 optical thin film
103 hard mask film
110 defect inspection apparatus
130 inspection optical system
150 comparative information acquisition unit
152 defect detection unit
153 control unit
154 image processing unit
155 memory device
156 display unit
BM1 inspection light
BM2 reflected light
BSP beam splitter
DEFT, DEF2, DEF3 pinhole defect (depressed defect)
DEF4, DEF5, DEF6 particle
DEFT depressed defect
ILS light source
L1 lens
MB photomask blank
OBL objective lens
SE photodetector
STG stage

The invention claimed is:

1. A defect inspection apparatus comprising:
a defect detection unit configured to acquire first defect information of a substrate; and
a comparative information acquisition unit configured to acquire a result of comparison between predetermined defect information stored in a storage unit and the first defect information, wherein
the substrate comprises multiple layers, and
wherein the substrate further comprises an optical thin film having a thickness of 10 nm or less as an outermost surface layer, and
wherein the comparative information acquisition unit is configured to acquire positional information on a defect where a part of the optical thin film is removed.

2. The defect inspection apparatus according to claim 1, wherein
each of the first defect information and the predetermined defect information includes the positional information and a size of the defect.

3. The defect inspection apparatus according to claim 1, wherein
the first defect information is acquired by irradiating inspection light, and
the inspection light for the substrate is moved by scanning the inspection light or moving the substrate.

4. A method for inspecting defect comprising:
acquiring first defect information of a substrate comprising multiple layers, the substrate further comprising an optical thin film having a thickness of 10 nm or less as an outermost surface layer,
cleaning the substrate by a substrate processing unit after acquiring the first defect information,
acquiring second defect information of the substrate after cleaning the substrate; and
acquiring a result of comparison between the first defect information and the second defect information and acquiring positional information on a defect where a part of the optical thin film is removed.

5. A method for manufacturing photomask blank comprising:
selecting a photomask blank by using the method for inspecting defect according to claim 4.

6. The defect inspection apparatus according to claim 1, wherein
the defect detection unit is configured to acquire second defect information on a defect before a predetermined processing for the substrate by a substrate processing unit,
the second defect information is used as the predetermined defect information, and
the comparative information acquisition unit is configured to acquire the result of comparison between the second defect information and the first defect information.

7. The defect inspection apparatus according to claim 6, wherein the predetermined processing is cleaning processing of the substrate.

8. The defect inspection apparatus according to claim 1, wherein
the comparative information acquisition unit is configured to acquire a place where change has occurred as the positional information based on change information obtained as the result of comparison between the predetermined defect information and the first defect information.

9. The defect inspection apparatus according to claim 8, further comprising:
a display unit that displays an enlarged image according to the positional information.

* * * * *